(12) United States Patent
Chao et al.

(10) Patent No.: US 9,449,989 B2
(45) Date of Patent: Sep. 20, 2016

(54) THIN FILM TRANSISTOR SUBSTRATE

(71) Applicant: INNOLUX CORPORATION, Chu-Nan, Miao-Li County (TW)

(72) Inventors: Kuang-Pin Chao, Chu-Nan (TW); Hsia-Ching Chu, Chu-Nan (TW); Ming-Chien Sun, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/541,105

(22) Filed: Nov. 13, 2014

(65) Prior Publication Data
US 2016/0071887 A1 Mar. 10, 2016

(30) Foreign Application Priority Data
Sep. 10, 2014 (TW) .............................. 103131121 A

(51) Int. Cl.
*H01L 27/12* (2006.01)
(52) U.S. Cl.
CPC ....... *H01L 27/1222* (2013.01); *H01L 27/1255* (2013.01)

(58) Field of Classification Search
None
See application file for complete search history.

(56) References Cited

U.S. PATENT DOCUMENTS

2012/0154704 A1* 6/2012 Nakazawa .......... H01L 27/1214 349/43
2012/0193625 A1* 8/2012 Sasagawa ......... H01L 29/41733 257/57

* cited by examiner

*Primary Examiner* — Matthew Reames
*Assistant Examiner* — Steven B Gauthier
(74) *Attorney, Agent, or Firm* — Liu & Liu

(57) ABSTRACT

A thin film transistor substrate is disclosed, which comprises: a substrate; and plural thin film transistor units disposed on the substrate and respectively comprising: an active layer disposed on the substrate and made of polysilicon; an insulating layer disposed on the active layer; and a source electrode and a drain electrode disposed on the insulating layer, wherein the insulating layer comprises a first region corresponding to the active layer and a second region corresponding to a region outside the active layer, and a roughness of the first region is larger than that of the second region.

11 Claims, 5 Drawing Sheets

THIN FILM TRANSISTOR SUBSTRATE

CROSS REFERENCE TO RELATED APPLICATION

This application claims the benefits of the Taiwan Patent Application Serial Number 103131121, filed on Sep. 10, 2014, the subject matter of which is incorporated herein by reference.

BACKGROUND OF THE INVENTION

1. Field of the Invention

The present invention relates to a thin film transistor (TFT) substrate and, more particularly, to a TFT substrate which can increase storage capacities of pixels and contact areas of insulating layers.

2. Description of Related Art

In recent years, all the display devices are developed toward having small volume, thin thickness and light weight as the display techniques progresses. Hence, a conventional cathode ray tube (CRT) display is gradually replaced by flat panel display devices such as a liquid crystal display (LCD) device and an organic light emitting diode (OLED) display device. The flat panel display devices can be applied to various fields. For example, the daily used devices such as cell phones, notebooks, video cameras, cameras, music players, navigation devices, and televisions are equipped with the flat panel display devices.

Although the LCD device and the OLED display device are commercially available and especially the techniques for the LCD device are much mature, every manufacturer is desired to develop display devices with improved display quality to meet customers' requirement as the display devices developed. In particular, the structure of the TFT substrate is one factor related to the display quality.

Even though the LCD device and the OLED display device are well developed and commercialized, it is still necessary to develop a display device with improved display quality to meet the customers' requirement.

SUMMARY OF THE INVENTION

The object of the present invention is to provide a thin film transistor (TFT) substrate, wherein storage capacities in pixels and contact area of an insulating layer can be increased.

To achieve the object, a first aspect of the present invention provides a thin film transistor substrate comprising: a substrate; and plural thin film transistor (TFT) units disposed on the substrate and respectively comprising: an active layer disposed on the substrate and made of polysilicon; an insulating layer disposed on the active layer; and a source electrode and a drain electrode disposed on the insulating layer, wherein the insulating layer comprises a first region corresponding to the active layer and a second region corresponding to a region outside the active layer, and a roughness of the first region is larger than that of the second region.

In the TFT substrate of the first aspect of the present invention, the TFT units may further respectively comprise a metal layer disposed on the insulating layer and having plural first protrusions.

In the TFT substrate of the first aspect of the present invention, the metal layer has a first thickness, the first protrusions respectively have a first height which is a distance between a top end of the first protrusion and an average surface of the metal layer, and the first height of the first protrusion may be 10% to 30% of the first thickness of the metal layer.

In the TFT substrate of the first aspect of the present invention, the insulating layer may have plural second protrusions.

In the TFT substrate of the first aspect of the present invention, the insulating layer has a second thickness, the second protrusions respectively have a second height which is a distance between a top end of the second protrusion and an average surface of the insulating layer, and the second height of the second protrusions may be 30% to 70% of the second thickness of the insulating layer.

In the TFT substrate of the first aspect of the present invention, the insulating layer may have plural second protrusions, and a part of the first protrusions of the metal layer may correspond to the second protrusions of the insulating layer.

In the TFT substrate of the first aspect of the present invention, the active layer has a side, and a curvature of the insulating layer corresponding to the side of the active layer may be smaller than that of the side thereof.

In addition, a second aspect of the present invention further provides another TFT substrate, which comprises: a substrate; and plural TFT units disposed on the substrate and respectively comprising: an active layer disposed on the substrate and made of polysilicon; an insulating layer disposed on the active layer; and a source electrode and a drain electrode disposed on the insulating layer, wherein the insulating layer has plural second protrusions.

In the TFT substrate of the second aspect of the present invention, the insulating layer has a second thickness, the second protrusions respectively have a second height which is a distance between a top end of the second protrusion and an average surface of the insulating layer, and the second height of the second protrusions may be 30% to 70% of the second thickness of the insulating layer.

In the TFT substrate of the second aspect of the present invention, the thin film transistor units may further respectively comprise a metal layer disposed on the insulating layer and having plural first protrusions.

In the TFT substrate of the second aspect of the present invention, the metal layer has a first thickness, the first protrusions respectively have a first height which is a distance between a top end of the first protrusion and an average surface of the metal layer, and the first height of the first protrusion may be 10% to 30% of the first thickness of the metal layer.

In the TFT substrate of the second aspect of the present invention, a part of the first protrusions of the metal layer may correspond to the second protrusions of the insulating layer.

In the TFT substrate of the second aspect of the present invention, the insulating layer may comprise a first region corresponding to the active layer and a second region corresponding to a region outside the active layer, and a roughness of the first region can be larger than that of the second region.

In the TFT substrate of the second aspect of the present invention, the active layer has a side, and a curvature of the insulating layer corresponding to the side of the active layer may be smaller than that of the side thereof.

In all the TFT substrate of the first and second aspects of the present invention, the surface of the insulating layer is designed to be in a lumpy shape with plural second protrusions formed thereon, resulting in the contact area of the insulating layer to other layers increased. Hence, the adhesion between the insulating layer and other layers can be increased, and the peeling therebetween can further be prevented. In addition, in all the TFT substrate of the first and second aspects of the present invention, the surface of the metal layer located on the insulating layer is further designed to be in a lumpy shape with plural first protrusions formed thereon, resulting in the surface of the metal layer increased. Hence, the metal layer can have increased capacity to further increase the storage capacities of pixels.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Figure 1:
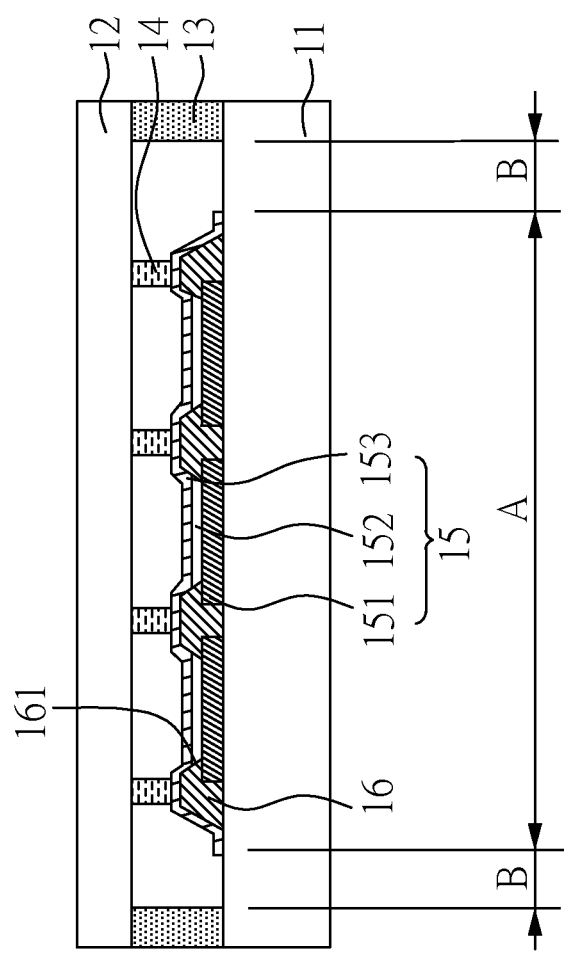
FIG. 1 is a cross-sectional view of an OLED display device according to one preferred embodiment of the present invention.

FIG. 1 is a cross-sectional view of an OLED display device according to one preferred embodiment of the present invention. During the process for manufacturing the OLED display device, a first substrate 11 and a second substrate 12 are firstly provided. Organic light emitting diode (OLED) units 15 and pixel defining layers 16 are disposed on the first substrate 11, wherein each pixel defining layer 16 is disposed between two adjacent OLED units 15. In addition, plural spacers 14 are disposed on the second substrate 12, and a sealant 13 (a frit sealant in the present embodiment) is formed on a periphery of the second substrate 12 in advance, which is formed through a dispensing process and a sintering process to be fixed on the second substrate 12. Then, the first substrate 11 is assembled with the second substrate 12, wherein the spacers 14 on the second substrate 12 correspond to regions outside the pixel opening 161 of the pixel defining layer 16. After the sealant 13 is adhered onto the first substrate 11 through a laser process, an OLED display device of the present embodiment is obtained.

In the present embodiment, both the first substrate 11 and the second substrate 12 are glass substrates. In addition, the OLED display device of the present embodiment comprises a display region A and a non-display region B, wherein the non-display region B is a region with circuits formed thereon. Furthermore, in the present embodiment, the OLED units 15 can respectively emit red, green and blue light; but the present invention is not limited thereto. For example, the OLED units 15 can be white OLED units, and a color filter unit (not shown in the figure) is further disposed on a side of the first substrate 11 or the second substrate 12.

Figure 2:
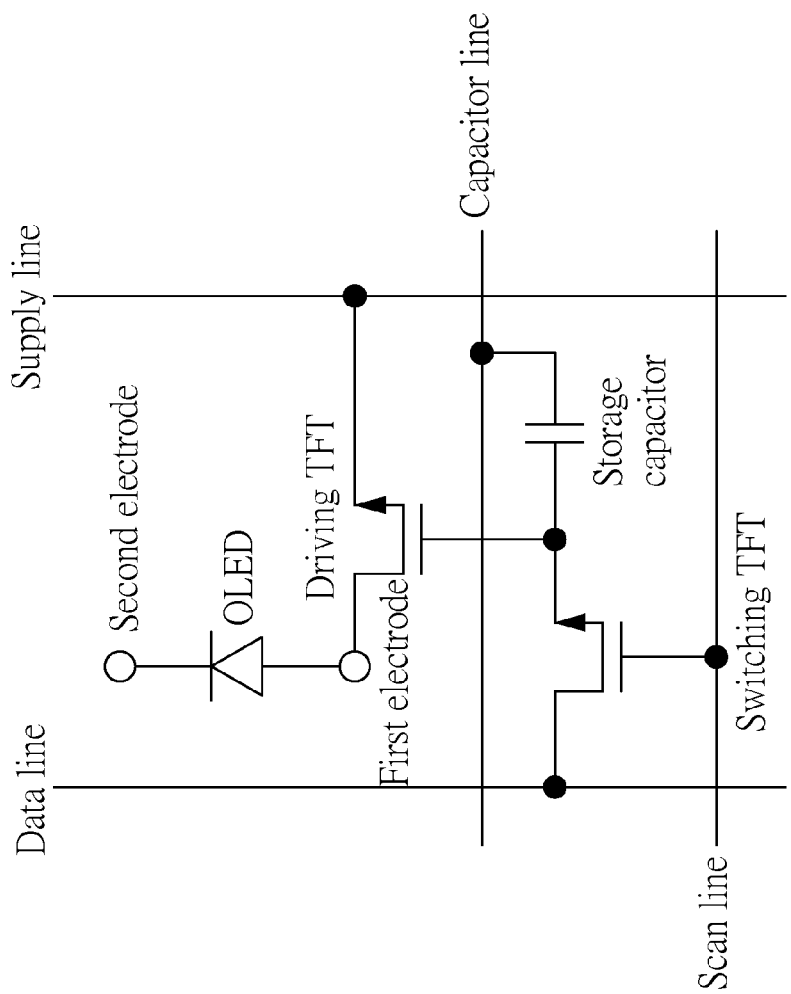
FIG. 2 is schematic view showing a layout of an OLED display device according to one preferred embodiment of the present invention.

FIG. 2 is a schematic view showing a layout of an OLED display device of the present embodiment. As shown in FIG. 2, in the OLED display device of the present embodiment, each pixel unit respectively comprises: a scan line, a data line, a capacitor line, a supply line, a switching TFT unit (shown as switching TFT in FIG. 2), a driving TFT unit (shown as driving TFT in FIG. 2), a storage capacitor, and an OLED unit (shown as OLED in FIG. 2) connecting to a first electrode and a second electrode.

Figure 3:
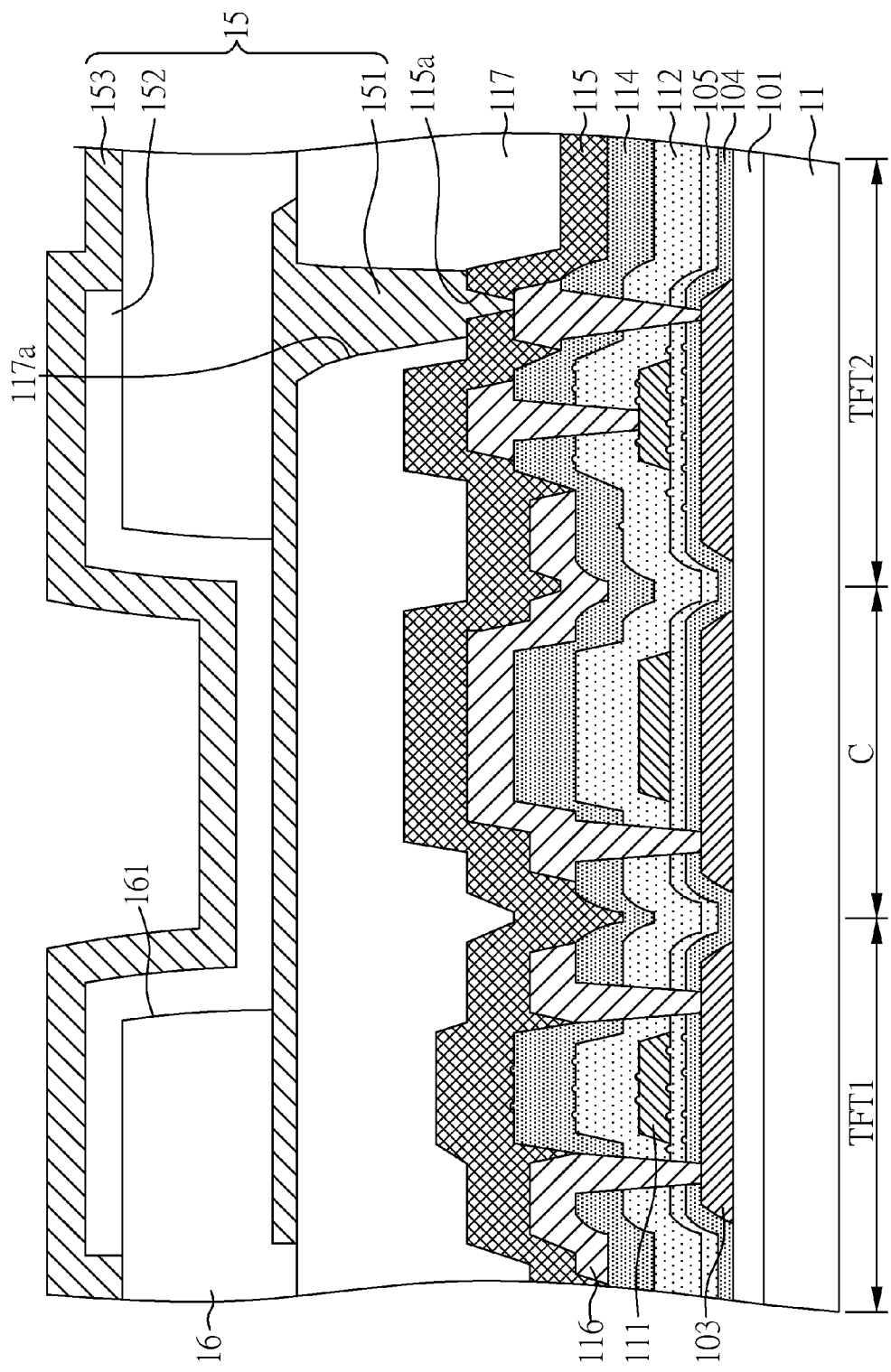
FIG. 3 is a cross-sectional view of a TFT substrate of an OLED display device according to one preferred embodiment of the present invention.

FIG. 3 is a cross-sectional view showing a partial display region of an OLED display device of the present embodiment. As shown in FIGS. 1 and 3, the OLED display device of the present embodiment comprises: a first substrate 11 and a second substrate 12 opposite thereto. In the present embodiment, the TFT units used in the OLED display device are low temperature poly-silicon (LTPS) TFT units. As shown in FIG. 3, in the display region A of FIG. 1, a first substrate 11 is firstly provided, a buffer layer 101 is formed thereon, and an active layer 103 is further formed on the buffer layer 101. In the present embodiment, the active layer 103 is made of polysilicon formed by annealing amorphous silicon. Next, a first insulating layer 104, a second insulating layer 105, a first metal layer 111, a third insulating layer 112 and a fourth insulating layer 114 are sequentially formed on the first substrate 11. Herein, the first metal layer 111 located in the TFT regions TFT1, TFT2 is served as gate electrodes. The first insulating layer 104 and the second insulating layer 105 are served as gate insulating layers, which are made of any insulating material generally used in the art, such as silicon oxides and silicon nitrides. In addition, the third insulating layer 112 and the fourth insulating layer 114 can also be made by the aforementioned insulating material generally used in the art. Then, a second metal layer 116 is formed on the fourth insulating layer 114. Herein, the second metal layer 116 located in the TFT regions TFT1, TFT2 further penetrate through the third insulating layer 112 and the fourth insulating layer 114, and selectively penetrate through the first insulating layer 104 and the second insulating layer 105, to be used as a source electrode and a drain electrode electrically connecting to the active layer 103. After the aforementioned process, the TFT substrate of the present embodiment is obtained. In the present embodiment, the TFT substrate comprises two TFT regions TFT1, TFT2, wherein the TFT region TFT1 corresponds to the switching TFT shown in FIG. 2, and the TFT region TFT2 corresponds to the driving TFT shown in FIG. 2. In addition, in the present embodiment, except for the TFT regions TFT1, TFT2, a capacitor region C is also formed, which corresponds to the storage capacitor shown in FIG. 2.

As shown in FIGS. 1 and 3, after the TFT substrate is formed, a protection layer 115, a planer layer 117, a first electrode 151 and a pixel defining layer 16 are sequentially formed thereon, wherein the first electrode 151 is formed not only on the planer layer 117 but also in a planer layer opening 117a of the planer layer 117 and a protection layer opening 115a of the protection layer 115 to electrically connect to the second metal layer 116. Furthermore, the pixel defining layer 16 is also formed with a pixel opening 161. Then, an organic light emitting layer 152 and a second electrode 153 are sequentially formed on the pixel defining layer 16 and the first electrode 151 as well as in the pixel opening 161 to finish the OLED unit 15 of the present embodiment. Hence, as shown in FIGS. 1 and 3, the OLED unit 15 of the present embodiment comprises a first electrode 151, an organic light emitting layer 152 and a second electrode 153 sequentially laminated, and the first electrode 151 electrically connects to the second metal layer 116. In addition, the pixel defining layer 16 locates between the first electrode 151 and the organic light emitting layer 152, and a light emitting region is defined by the pixel opening 161 of the pixel defining layer 16.

In the present embodiment, the first metal layer 111 and the second metal layer 116 are used as circuits. For example, as shown in FIG. 3, the first metal layer 111 herein is used as a gate electrode of a TFT unit, and the second metal layer 116 is used as a source electrode and a drain electrode thereof. In addition, the gate electrode and a scan line (not shown in the figure) simultaneously formed by the first metal layer 111 electrically connect to each other, and the source and drain electrodes and a data line (not shown in the figure) simultaneously formed by the second metal layer 116 also electrically connect to each other. In the present embodiment, the first metal layer 111 and the second metal layer 116 can be made of any conductive material generally used in the art, such as metals, alloys, metal oxide, metal oxynitrides, and other electrode materials generally used in the art; and preferably metals. In the present embodiment, the first metal layer 111 is made of Mo, and the second metal layer 116 is a composite metal layer with a Ti layer, an Al layer and another Ti layer sequentially laminated from a side facing to the first substrate 11. In addition, the protection layer 115 is made of any insulating material generally used in the art, such as silicon oxides and silicon nitrides.

In the present embodiment, the first electrode 151 can be made of any material for reflective electrodes generally used in the art, and the second electrode 153 can be made of any material for transparent or semi-transparent electrodes generally used in the art. The materials for the reflective electrodes may be Ag, Ge, Al, Cu, Mo, Ti, Sn, AlNd, ACX or APC, the materials for the transparent electrodes may be transparent conductive oxides (TCO) such as ITO and IZO, and the semi-transparent electrodes may be metal thin film electrodes such as Mg/Ag alloy thin film electrodes, Au thin film electrodes, Pt thin film electrodes and Al thin film electrodes. In addition, the second electrode 153 used herein can be a composite electrode of a transparent electrode and a semi-transparent electrode (for example, a composite electrode of a TCO electrode and a Pt thin film electrode), if it is needed. Herein, only the OLED unit comprising the first electrode 151, the organic light emitting layer 152 and the second electrode 153 is present, but the present invention is not limited thereto. Other OLED units generally used in the art can also be applied to the OLED display panel of the present invention, for example, the OLED unit comprising an electron transporting layer, an electron injection layer, a hole transporting layer, a hole injection layer, and/or other layers capable of facilitating the combination of holes and electrons.

Figure 4:
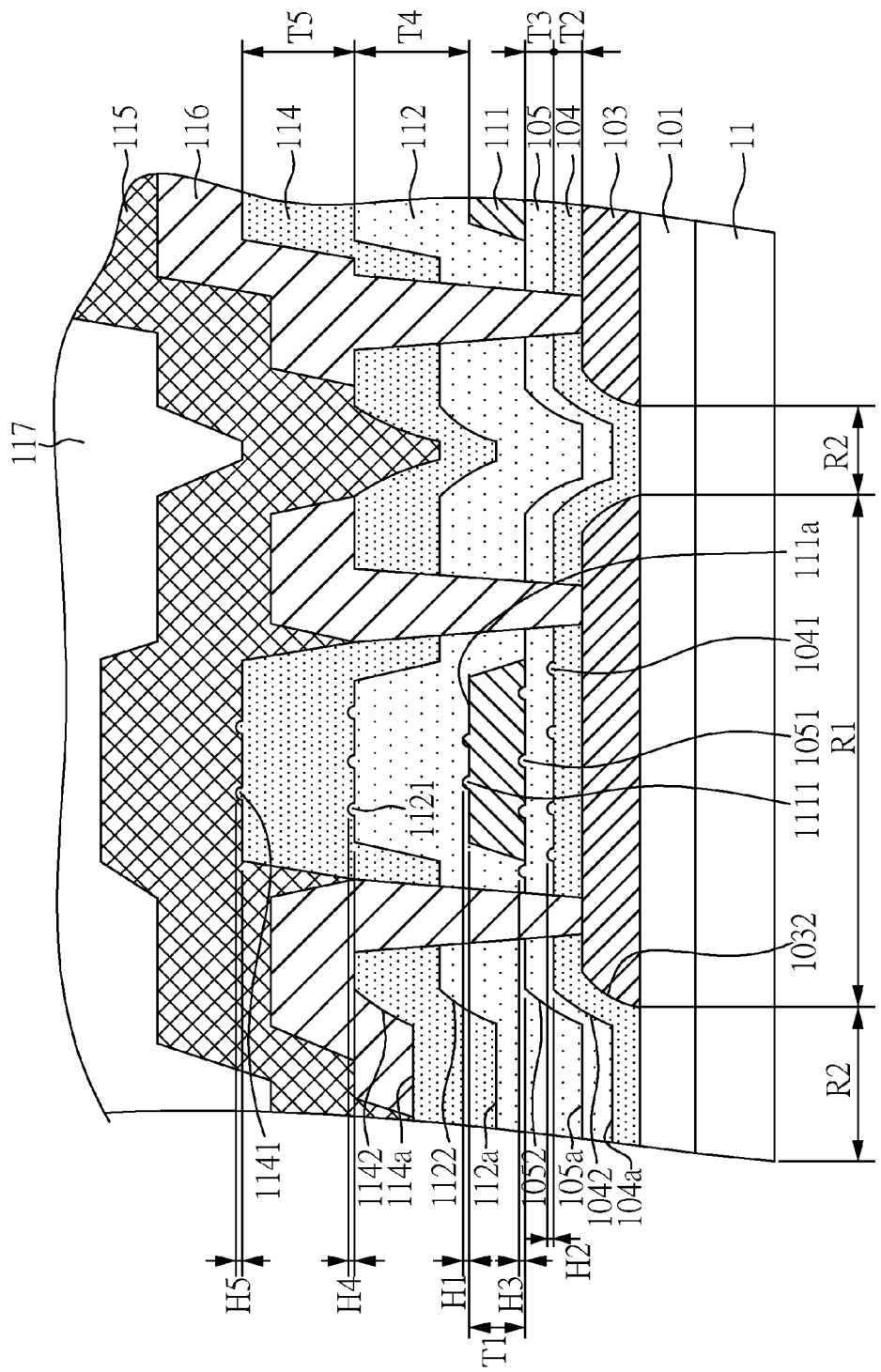
FIG. 4 is a cross-sectional view showing a partial TFT substrate of an OLED display device according to one preferred embodiment of the present invention.
Figure 5:
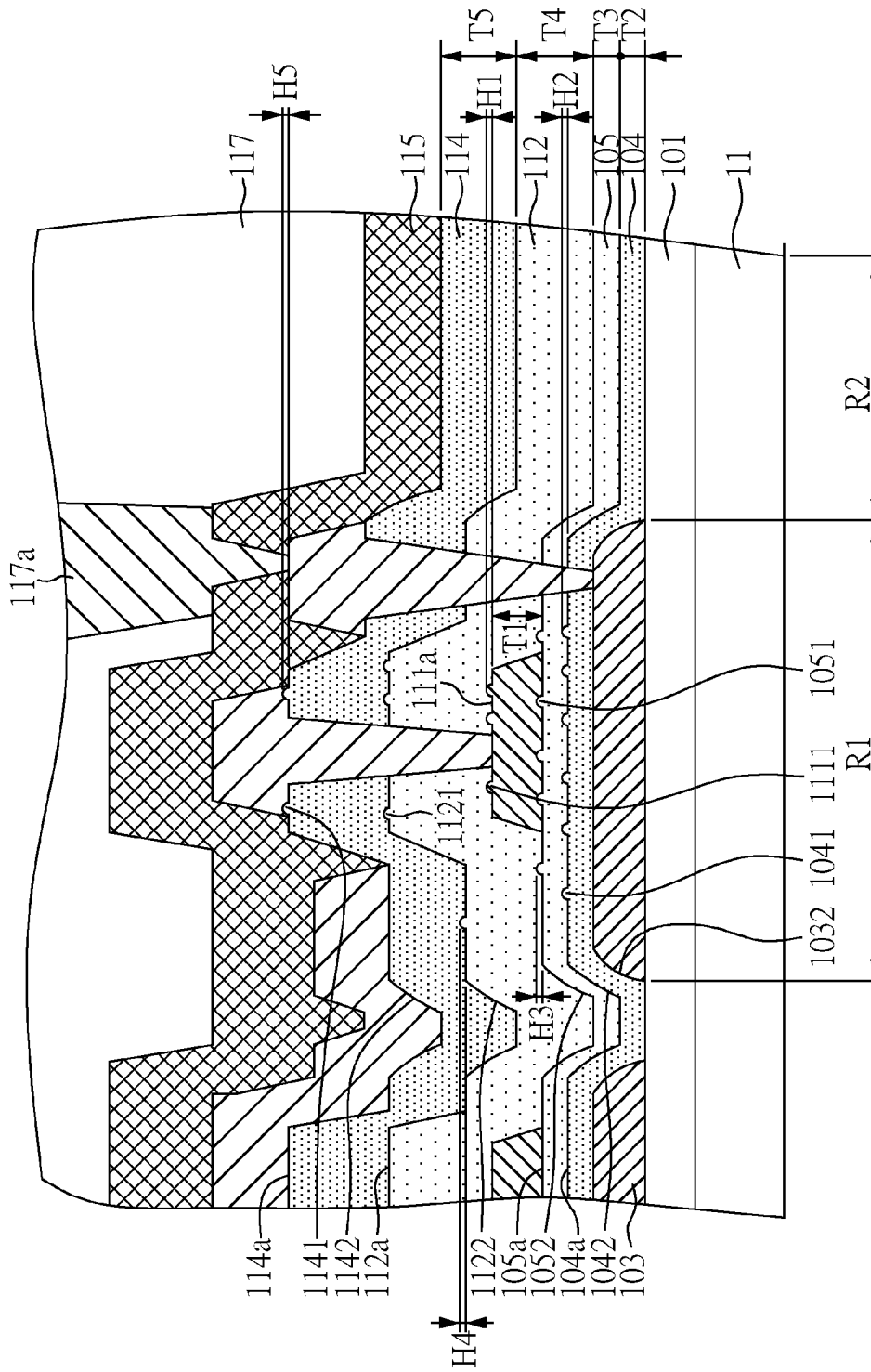
FIG. 5 is a cross-sectional view showing a partial TFT substrate of an OLED display device according to one preferred embodiment of the present invention.

FIGS. 4 and 5 are cross-sectional views showing a partial TFT substrate of an OLED display device of the present embodiment, which are respectively enlarge views of the TFT regions TFT1, TFT 2 shown in FIG. 3. As shown in FIGS. 4 and 5, after the active layer 103 is formed, during the respective processes for forming the first insulating layer 104, the second insulating layer 105, the first metal layer 111, the third insulating layer 112 and the fourth insulating layer 114, patterned masks are used to respectively etch these layers after the layers are formed by deposition processes known in the art, to make the first insulating layer 104, the second insulating layer 105, the first metal layer 111, the third insulating layer 112 and the fourth insulating layer 114 respectively have a lumpy surface having bumps.

More specifically, as shown in FIGS. 4 and 5, the first insulating layer 104, the second insulating layer 105, the third insulating layer 112 and the fourth insulating layer 114 respectively comprise a first region R1 corresponding to the active layer 103 and a second region R2 corresponding to a region outside the active layer 103, and a roughness of the first region R1 is larger than that of the second region R2.

In addition, as shown in FIGS. 4 and 5, the first insulating layer 104, the second insulating layer 105, the third insulating layer 112 and the fourth insulating layer 114 respectively have plural second protrusions 1041, 1051, 1121, 1141. Herein, a distance between a top end of each second protrusion 1041 and an average surface 104a of the first insulating layer 104 near to the second protrusion 1041, a second height H2, is respectively 500 nm~1500 nm; a distance between a top end of each second protrusion 1051 and an average surface 105a of the second insulating layer 105 near to the second protrusion 1051, a second height H3, is respectively 500 nm~1500 nm; a distance between a top end of each second protrusion 1121 and an average surface 112a of the third insulating layer 112 near to the second protrusion 1121, a second height H4, is respectively 500 nm~1500 nm; and a distance between a top end of each second protrusion 1141 and an average surface 114a of the fourth insulating layer 114 near to the second protrusion 1141, a second height H5, is respectively 500 nm~1500 nm.

Furthermore, as shown in FIGS. 4 and 5, the first insulating layer 104 has a second thickness T2, and the second height H2 of the second protrusions 1041 is 30% to 70% of the second thickness T2 of the first insulating layer 104; the second insulating layer 105 has a second thickness T3, and the second height H3 of the second protrusion 1051 is 20% to 50% of the second thickness T3 of the second insulating layer 105; the third insulating layer 112 has a second thickness T4, and the second height H4 of the second protrusion 1121 is 10% to 40% of the second thickness T4 of the third insulating layer 112; and the fourth insulating layer 114 has a second thickness T5, and the second height H5 of the second protrusion 1141 is 5% to 30% of the second thickness T5 of the fourth insulating layer 114.

As illustrated above, in the TFT substrate of the present invention, the first insulating layer, the second insulating layer, the third insulating layer and the fourth insulating layer are designed to have surfaces present in lumpy shapes having second protrusions formed thereon, and therefore the contact areas of the insulating layers to other layers can be increased. Hence, the adhesions between the insulating layers and other layers can be improved, and the peeling therebetween can further be prevented.

In addition, as shown in FIGS. 4 and 5, in the TFT substrate of the present embodiment, the first metal layer 111 also has a lumpy surface with bumps formed thereon. Herein, the first metal layer 111 may further have plural first protrusions 1111, wherein a distance between a top end of each first protrusion 1111 and an average surface 111a of the first metal layer 111 near to the first protrusions 1111, a first height H1, is respectively 500 nm~1500 nm. Furthermore, the first metal layer 111 has a first thickness T1, the first height H1 of the first protrusion 1111 is 10% to 30% of the first thickness T1 of the first metal layer 111.

As illustrated above, in the TFT substrate of the present invention, the metal layer is designed to have a surface present in a lumpy shape having first protrusions formed thereon, and therefore the area of the metal layer can be increased. Hence, the metal layer can have increased capacity to further increase the storage capacities of pixels.

In addition, as shown in FIGS. 4 and 5, positions of the second protrusion 1041 of the first insulating layer 104, the second protrusion 1051 of the second insulating layer 105, the second protrusion 1121 of the third insulating layer 112, the second protrusion 1141 of the fourth insulating layer 114, and the first protrusion 1111 of the first metal layer 111 can be correspond or not correspond to each other, which can be adjusted according to device requirements.

Furthermore, as shown in FIGS. 4 and 5, the active layer 103 has a side 1032, and an inclined surface 1042 of the first insulating layer 104, an inclined surface 1052 of the second insulating layer 105, an inclined surface 1122 of the third insulating layer 112 and an inclined surface 1142 of the fourth insulating layer 114 respectively correspond to the side 1032 of the active layer 103. Herein, a curvature of one of the inclined surface 1042, 1052, 1122, 1142 is smaller than that of the side 1032 thereof.

In the present invention, the term "average surface" refers to an optimal surface of the sample, which can be a mean surface obtained from an arithmetic average of the absolute values or a square average of the profile height deviations from the mean line, recorded within the evaluation length.

The TFT substrate obtained from the aforementioned embodiment of the present invention can be applied to an OLED display device as well as a LCD device. In addition, the display device provided by the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A thin film transistor substrate, comprising:
a substrate; and
plural thin film transistor units disposed on the substrate and respectively comprising:
an active layer disposed on the substrate and made of polysilicon;
a first insulating layer disposed on the active layer; and
a source electrode and a drain electrode disposed on the first insulating layer,
wherein the first insulating layer comprises a first region corresponding to the active layer and a second region corresponding to a region outside the active layer, and a roughness of a top surface of the first region is greater than a roughness of a top surface of the second region,
wherein the thin film transistor units further respectively comprise a metal layer disposed on the first insulating layer and a second insulating layer disposed on the metal layer, wherein the metal layer has plural first protrusions at a top surface of the metal layer, wherein the second insulating layer comprises a third region corresponding to the first region and a fourth region corresponding to the second region, and wherein a roughness of a top surface of the third region is greater than a roughness of a top surface of the fourth region.

2. The thin film transistor substrate as claimed in claim 1, wherein the first insulating layer has plural second protrusions at the top surface of the first region of the first insulating layer.

3. The thin film transistor substrate as claimed in claim 2, wherein the first region of the first insulating layer has a second thickness, the second protrusions respectively have a second height which is a distance between a top end of the second protrusion and the top surface of the first region of the first insulating layer, and the second height of the second protrusions is 30% to 70% of the second thickness of the first region the first insulating layer.

4. The thin film transistor substrate as claimed in claim 1, wherein the first insulating layer has plural second protrusions, and a region of the first protrusions of the metal layer correspond to a region of the second protrusions of the first insulating layer.

5. The thin film transistor substrate as claimed in claim 1, wherein the active layer has a side, and a curvature of the first insulating layer corresponding to the side of the active layer is less than that of the side of the active layer.

6. A thin film transistor substrate, comprising:
a substrate; and
plural thin film transistor units disposed on the substrate and respectively comprising:
an active layer disposed on the substrate and made of polysilicon;
a first insulating layer disposed on the active layer; and
a source electrode and a drain electrode disposed on the first insulating layer,
wherein the first insulating layer has plural second protrusions at a top surface of the first insulating layer, wherein the thin film transistor units further respectively comprise a metal layer disposed on the first insulating layer and a second insulating layer disposed on the metal layer, wherein the metal layer has plural first protrusions at a top surface of the metal layer, wherein the second insulating layer comprises a third region corresponding to the active layer and a fourth region corresponding to a region outside the active layer, and wherein a roughness of a top surface of the third region is greater than a roughness of a top surface of the fourth region.

7. The thin film transistor substrate as claimed in claim 6, wherein the first insulating layer has a region having a second thickness, the second protrusions respectively have a second height which is a distance between a top end of the second protrusion and a top surface of the region of the first insulating layer, and the second height of the second protrusions is 30% to 70% of the second thickness of the region of the first insulating layer.

8. The thin film transistor substrate as claimed in claim 6, wherein the metal layer has a region having a first thickness, the first protrusions respectively have a first height which is a distance between a top end of the first protrusion and a top surface of the region of the metal layer, and the first height of the first protrusion is 10% to 30% of the first thickness of the region of the metal layer.

9. The thin film transistor substrate as claimed in claim 6, wherein a region of the first protrusions of the metal layer correspond to a region of the second protrusions of the first insulating layer.

10. The thin film transistor substrate as claimed in claim 6, wherein the first insulating layer comprises a first region corresponding to the active layer and a second region corresponding to a region outside the active layer, and a roughness of a top surface of the first region is greater than a roughness of a top surface of the second region.

11. The thin film transistor substrate as claimed in claim 6, wherein the active layer has a side, and a curvature of the first insulating layer corresponding to the side of the active layer is less than that of the side of the active layer.

* * * * *